US011169295B2

(12) United States Patent
Miller et al.

(10) Patent No.: US 11,169,295 B2
(45) Date of Patent: Nov. 9, 2021

(54) NMR DATA ACQUISITION WHILE SWITCHING NMR ACTIVATION SETS

(71) Applicant: Halliburton Energy Services, Inc., Houston, TX (US)

(72) Inventors: Daniel Lee Miller, Kingwood, TX (US); MingJen Wang, Bellaire, TX (US); Wei Shao, Conroe, TX (US); Songhua Chen, Katy, TX (US); Ronnel Charles Balliet, Houston, TX (US)

(73) Assignee: HALLIBURTON ENERGY SERVICES, INC., Houston, TX (US)

( * ) Notice: Subject to any disclaimer, the term of this patent is extended or adjusted under 35 U.S.C. 154(b) by 114 days.

(21) Appl. No.: 16/746,452

(22) Filed: Jan. 17, 2020

(65) Prior Publication Data

US 2020/0333501 A1 Oct. 22, 2020

Related U.S. Application Data

(60) Provisional application No. 62/834,845, filed on Apr. 16, 2019.

(51) Int. Cl.
*G01V 3/14* (2006.01)
*G01R 33/54* (2006.01)

(52) U.S. Cl.
CPC .............. *G01V 3/14* (2013.01); *G01R 33/543* (2013.01)

(58) Field of Classification Search
CPC .......... G01V 3/14; G01V 3/32; G01R 33/543; G01R 33/448; G01N 24/081
See application file for complete search history.

(56) References Cited

U.S. PATENT DOCUMENTS

| 7,301,338 | B2 | 11/2007 | Gillen et al. |
| 7,565,833 | B2 | 7/2009 | Gillen et al. |
| 2003/0001568 | A1 | 1/2003 | Edwards |
| 2004/0104048 | A1 | 6/2004 | Woodburn et al. |
| 2005/0257610 | A1 | 11/2005 | Gillen et al. |
| 2006/0017442 | A1* | 1/2006 | Folberth ............... G01V 13/00 324/334 |
| 2011/0187372 | A1 | 8/2011 | Kruspe |
| 2016/0033670 | A1 | 2/2016 | Reiderman et al. |

OTHER PUBLICATIONS

PCT Application Serial No. PCT/US2020/014192, International Search Report, dated May 15, 2020, 5 pages.
PCT Application Serial No. PCT/US2020/014192, International Written Opinion, dated May 15, 2020, 7 pages.

* cited by examiner

*Primary Examiner* — Susan S Lee
(74) *Attorney, Agent, or Firm* — Gilliam IP PLLC

(57) ABSTRACT

An NMR logging system is disclosed which continues logging without interruption despite switching activation sets to adapt to changes in formation properties. Based on detection of an approaching or encountered geological boundary, an appropriate activation set is transmitted to the downhole NMR tool while the NMR tool continues logging. This system optimizes NMR data collection for each formation and associated formation fluid properties while reducing the need to stop the tool string movement while switching the activation set, and reduces incomplete collection of NMR and non-NMR logging tool data.

20 Claims, 8 Drawing Sheets

| Configuration Record for T1T2 Activation Set 204 | | | | |
|---|---|---|---|---|
| Time & Date (ucts) | Depth (ft) | T/D Activity | ActivationName | FreqSwpBand[0] |
| 06-Oct-18 05:48:54:612 | 9932.5683 | None | T1T2OSHAL | 1 |

| T1T2 Data Record 206 | | | |
|---|---|---|---|
| Time & Date (ucts) | Depth (ft) | T/D Activity | XMR Real Echo |
| 06-Oct-18 05:49:42:203 | 9930.2617 | Trip Out | 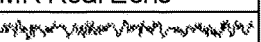 |

| Configuration Record for T2 Activation Set 208 | | | | |
|---|---|---|---|---|
| Time & Date (ucts) | Depth (ft) | T/D Activity | ActivationName | FreqSwpBand[0] |
| 13-Nov-18 00:51:12:495 | 9688.8000 | None | T203 | 1 |

| T2 Data Record 210 | | | |
|---|---|---|---|
| Time & Date (ucts) | Depth (ft) | T/D Activity | XMR Real Echo |
| 13-Nov-18 00:51:13:223 | 9688.7633 | Trip Out | 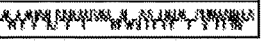 |

Non Continuous Logging Data Structure 202

| Configuration Record for T1T2 and T2 Activation Sets 242 | | | | |
|---|---|---|---|---|
| Time & Date (ucts) | Depth (ft) | T/D Activity | ActivationName | FreqSwpBand[0] |
| 14-Feb-19 11:01:23:285 | 2229.2163 | None | T203 | 1 |
| 14-Feb-19 11:13:10:420 | 9917.4677 | None | T1T2OSHAL | 1 |

| Data Record for T1T2 and T2 Activation Sets 244 | | | | |
|---|---|---|---|---|
| Time & Date (ucts) | Depth (ft) | T/D Activity | XMR Real Echo | Activation Index |
| 14-Feb-19 11:12:51:185 | 9919.7120 | Trip Out | 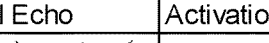 | 1 |
| 14-Feb-19 11:14:09:784 | 9910.5412 | Trip Out | 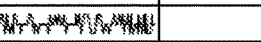 | 2 |

Continuous Logging Data Structure 240

FIG. 2

NMR DATA ACQUISITION WHILE SWITCHING NMR ACTIVATION SETS

TECHNICAL FIELD

The disclosure generally relates to the field of formation evaluation, and more particularly to systems and methods for acquiring nuclear magnetic resonance (NMR) data in a geologic formation while changing NMR logging activation sets.

BACKGROUND

A well is drilled through multiple formation stratigraphic layers, multiple reservoirs, and multiple formation fluid types. While the well is being drilled, logging tools such as nuclear magnetic resonance (NMR) logging tools are used to acquire NMR data such as formation and formation fluid properties. The NMR logging tools collect different types of NMR data that are sensitive to different reservoir types and different fluids. The NMR logging tools need to switch from one activation set to another so that precise timing sequences of radio frequency (RF) pulsing, acquisition parameters, and/or measurement parameters are set correctly during the logging as the formation and formation fluid properties change. To switch activation sets, NMR logging tool movement and data acquisition are paused and data recording for the current activation set is closed. A new activation set is downloaded to the tool string, and the NMR logging restarts. The pausing of the NMR logging tool movement results in longer operation time to complete the NMR logging. The NMR logging tool is typically on a tool string with non-NMR logging tools. As a result, each non-NMR logging tool, such as gamma ray detector, neutron-scattering detector, spectral density too, etc., on the tool string is also stopped but at offset depths due to sensors being located at different points along the tool string. Therefore, the NMR and non-NMR logging tools report only partial datasets at various depths around where the NMR activation sets were changed. Acquiring a complete data set requires moving the tool string in a reverse direction and relogging to overlap the prior partial dataset interval with NMR data under the new activation set and uninterrupted non-NMR data, also wasting additional time.

BRIEF DESCRIPTION OF THE DRAWINGS

Embodiments of the disclosure may be better understood by referencing the accompanying drawings.

FIG. 2 contrasts examples of structures for continuous and non-continuous NMR logging.

Figure 1:
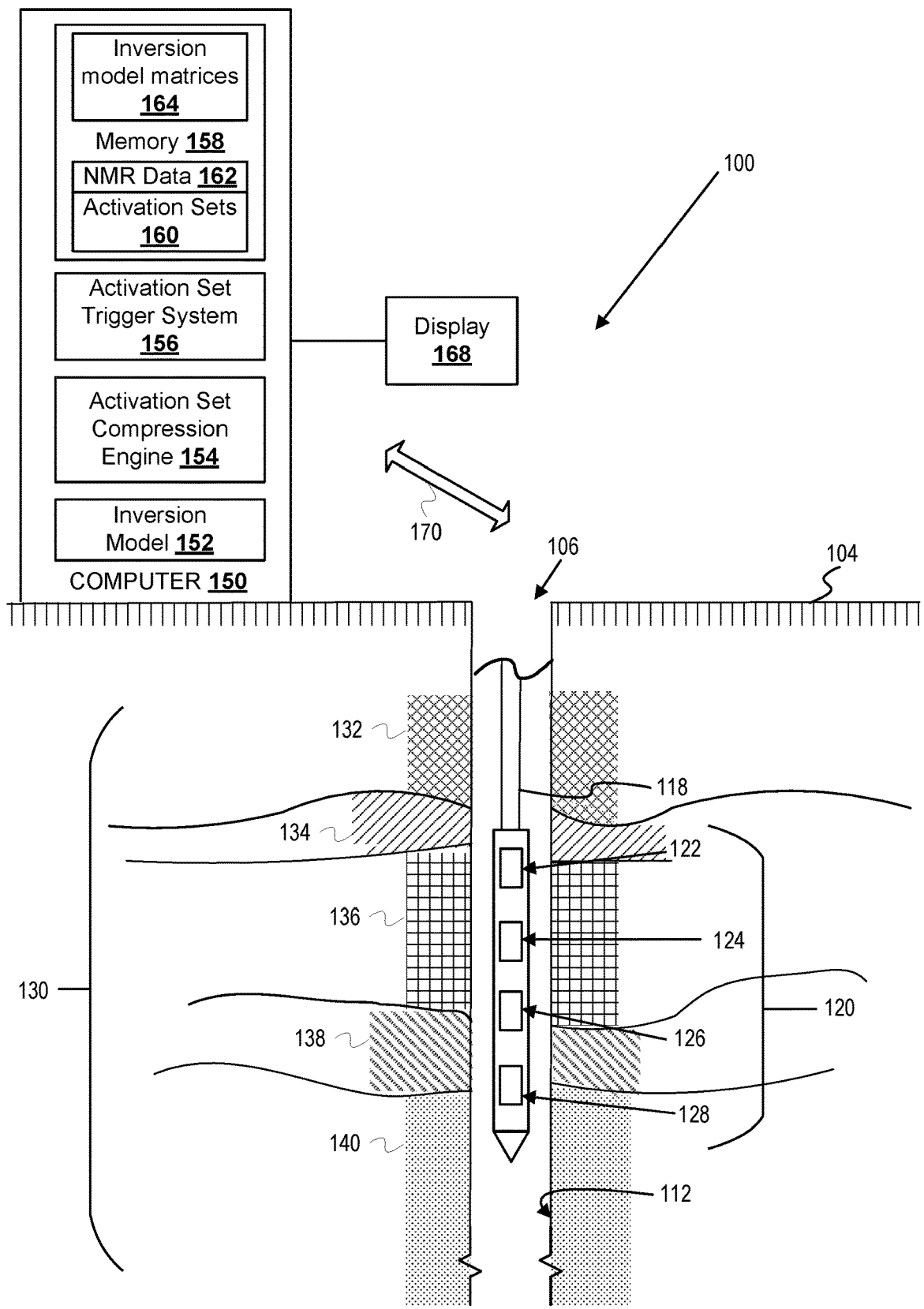
FIG. 1 illustrates an example logging system in which NMR data is acquired while activation sets associated with an NMR logging tool are changed.

The drawings are for purpose of illustrating example embodiments, but it is understood that the inventions are not limited to the arrangements and instrumentalities shown in the drawings.

DESCRIPTION OF EMBODIMENTS

The description that follows includes example systems, methods, techniques, and program flows that embody aspects of the disclosure. However, it is understood that this disclosure may be practiced without these specific details. For instance, this disclosure refers to efficiently acquiring nuclear magnetic resonance (NMR) data in a geologic formation with changing formation properties while changing NMR logging tool activation sets in illustrative examples. Aspects of this disclosure can be instead applied to types of logging other than NMR data. In other instances, well-known instruction instances, protocols, structures and techniques have not been shown in detail in order not to obfuscate the description.

A nuclear magnetic resonance (NMR) logging tool is used to collect NMR data in the geologic formation as a function of depth. NMR imaging gathers information about the atomic spin and state by measuring the effect of a magnetic field on mobile atoms. NMR can be used to determine fluid properties, such as porosity, fluid phase, fluid stoichiometry, and diffusion coefficient. The NMR logging tool uses NMR logging activation sets (hereinafter "activation sets") which can be changed as the NMR logging tool passes through the different formation intervals, in order to collect the desired NMR data associated with each formation interval.

In order to change an activation set while logging, movement of the tool string and NMR data logging is stopped and only then is the activation set changed. The logging is stopped for various reasons. For example, telemetry from the surface to the logging tool is designed such that the downlink data is much slower than uplink data. A typical wireline telemetry may have an uplink data rate of 500 kb/s while the downlink data rate is 50 kb/s. Several minutes are required to send a new activation set from a computer at the surface down to the NMR logging tool in the well. During this time, logging data is not sent to the surface since acknowledgement messages would be blocked by the download of the activation set due to insufficient bandwidth to accommodate both the acknowledgement message and the new activation set. The change in activation set also interrupts collection of the NMR data. Attempting to transmit NMR data while downloading an activation set can cause corruption of the NMR data. Furthermore, the change to a new activation set likely incurs a cost of reinitializing a corresponding NMR inversion matrix.

An NMR logging system is disclosed which continues logging without interruption despite switching activation sets to adapt to changes in formation properties. Based on detection of an approaching or encountered geological boundary, an appropriate activation set is transmitted to the downhole NMR tool while the NMR tool continues logging. This system optimizes NMR data collection for each formation and associated formation fluid properties while reducing the need to stop the tool string movement while switching the activation set, and reduces incomplete collection of NMR and non-NMR logging tool data.

FIG. 1 illustrates an example logging system 100 in which NMR data is acquired by an NMR logging tool 126 while associated activation sets 160 are changed. The logging system includes a tool string 120 positioned in a wellbore 112 of a geologic formation 130 and a computer 150 located at the surface 104. The tool string 120 may have one or more logging tools including an NMR logging tool 126 and other non-NMR logging tools 122, 128 such as neutron, gamma, density, resistivity tools. The non-NMR tool 122 is positioned above the NMR logging tool 126 in FIG. 1. The NMR tool 126 is positioned above a non-NMR tool 128 on the tool string. The tools 122, 126, 128 may be positioned at a location other than at an end of the logging tool 120.

The tool string 120 may be part of a drill string in which case the tool string performs measuring while drilling (MWD) or logging while drilling (LWD) operations while drilling the wellbore. Alternatively, the tool string may be part of wireline tool which is conveyed down the wellbore via a wireline 118. Other conveyance types may be used for conveying the tool string into borehole, including coiled tubing, wired drill pipe, slickline, and downhole tractor, for example.

The tool string 120 may be communicatively coupled to the computer 150 via a wired or wireless connection 170. The wired connection may be a cable which facilitates communication while the wireless connection may be one or more of an electromagnetic, mud pulse, or acoustic connection which facilitates communication. The computer 150 may comprise one or more systems for logging and processing NMR data 162. The computer 150 stores an inversion model 152 that uses the parameters from the activation sets 160 to calculate a set of inversion model matrices 164. These inversion model matrices 164 are then stored in a memory 158, along with NMR data 162 and activation sets 160, so that the raw NMR data can be processed, and fluid properties determined in real time. The computer 150 also has an activation set trigger system 156 that determines, based on machine learning, operator instructions, or another preset parameter, when to change an activation set. An activation set compression engine 154 then compresses the selected one of the activation sets 160 for transmission downhole via the communication connection 170. A decompression engine 124 decompresses the transmitted one of the activation sets 160 and parameters of the NMR tool 126 are changed accordingly. The computer 150 also has a display 168 that displays the data log plot and provides information to operators.

Each of the activation sets 160 include data acquisition parameters, examples of which include the applied magnetic field B, directional gradient of the magnetic field G, precise timing sequences of RF pulsing, RF frequency bands, wait time Tw, echo train time $T_E$, number of repeats, and number of pulses, etc.

The NMR logging tool activation sets 160 can be changed as the NMR logging tool 126 passes through the different formation intervals 130, in order to collect the desired NMR data associated with each formation strata 132, 134, 136, 138, 140. The activation sets 160 may include such NMR data acquisition parameters as are necessary to distinguish formation properties. The NMR parameters needed to distinguish fluid properties—such as fluid phase, fluid stoichiometry, diffusion coefficient, and porosity—will vary based on formation type. The fluid properties can then be used to determine formation properties such as reservoir type, fluid type, rock type, etc. Formation properties as used herein may include fluid properties, as they are dependent upon the formation in which the fluid is found.

Table 1 and Table 2 provide examples of various parameters included in example activation sets.

TABLE 1

T1-T2 Organic Shale Activation Set

| Activation Name | Frequency Band | Wait Time [ms] | Echo Spacing [ms] | Number of Echoes | Number of Repeats |
|---|---|---|---|---|---|
| Activation 1 | 1 | 6100 | 0.3 | 1500 | 1 |
| Activation 2 | 3 | 610 | 0.3 | 1500 | 1 |
| Activation 3 | 1 | 16 | 0.3 | 30 | 32 |
| Activation 4 | 3 | 1 | 0.3 | 10 | 102 |
| Activation 5 | 1 | 50 | 0.3 | 30 | 12 |
| Activation 6 | 3 | 1000 | 0.3 | 1000 | 1 |
| Activation 7 | 5 | 4000 | 0.3 | 1500 | 1 |
| Activation 8 | 2 | 4300 | 0.3 | 1500 | 1 |
| Activation 9 | 2 | 150 | 0.3 | 150 | 6 |
| Activation 10 | 4 | 8 | 0.3 | 20 | 56 |
| Activation 11 | 2 | 1000 | 0.3 | 1000 | 1 |
| Activation 12 | 4 | 500 | 0.3 | 500 | 1 |
| Activation 13 | 2 | 500 | 0.3 | 500 | 1 |
| Activation 14 | 5 | 4 | 0.3 | 12 | 44 |
| Activation 15 | 2 | 500 | 0.3 | 500 | 1 |
| Activation 16 | 5 | 4 | 0.3 | 12 | 44 |
| Activation 17 | 2 | 500 | 0.3 | 500 | 1 |

TABLE 2

T1-T2-D 3D Activation Set

| Activation Name | Frequency Band | Wait Time [ms] | Echo Spacing [ms] | Number of Echoes | Number of Repeats |
|---|---|---|---|---|---|
| Activation 1 | 4 | 7300 | 0.3 | 2000 | 1 |
| Activation 2 | 1 | 8600 | 2.0 | 225 | 1 |
| Activation 3 | 3 | 8600 | 3.0 | 120 | 1 |
| Activation 4 | 4 | 2500 | 0.3 | 1667 | 1 |
| Activation 5 | 1 | 1500 | 0.3 | 1667 | 1 |
| Activation 6 | 4 | 16 | 0.3 | 27 | 24 |
| Activation 7 | 1 | 60 | 0.3 | 133 | 4 |
| Activation 8 | 3 | 2700 | 0.3 | 1667 | 1 |
| Activation 9 | 2 | 8700 | 0.3 | 2000 | 1 |
| Activation 10 | 7 | 8800 | 4.0 | 100 | 1 |
| Activation 11 | 2 | 60 | 0.3 | 133 | 4 |
| Activation 12 | 2 | 250 | 0.3 | 417 | 4 |
| Activation 13 | 7 | 16 | 0.3 | 27 | 24 |
| Activation 14 | 5 | 11500 | 1.0 | 600 | 1 |
| Activation 15 | 6 | 11000 | 2.0 | 225 | 1 |
| Activation 16 | 6 | 4 | 0.3 | 13 | 48 |

The wellbore 112 in the example geologic formation 130 shown in FIG. 1 has from top to bottom, several major rock formation types including, sandstone 132, organic shale 134, limestone 136, and tight mudstone 138. The sandstone 132 and limestone 136 are conventional reservoirs containing water and hydrocarbon oil and/or gas. The shale 134 and carbonate mudstone 138 formation intervals contain unconventional shale oil, condensates, or gas. In the example strata, the shale 134 contains shale oil and the mudstone 138 contains shale gas. The sandstone 132 formation is water-wet, thus the light oil in its pore spaces exhibit long T1 and T2 decay and high diffusivity, requiring a typical 3D NMR activation set. To discern fluid types, the activation set should be sensitive to T1, T2, and diffusion contrast, with substantially long echo trains required to obtain adequate spectral resolution. The unconventional shale 134 reservoir contains fluids with short T1 and short T2, where the T1/T2 ratio is the parameter of interest and requires an activation set that produces adequate signal to noise ratio (SNR) for fast decay times in order to resolve the T1/T2 ratios of different fluids. $T_E$ echo time can be much shorter compared to that used in sandstone 132 formation, which saves total logging time. The limestone 136 reservoir formation is mixed-wet and contains condensates having a high diffusivity value. Therefore, the desirable activation set, though similar to the 3D NMR logging activation set in the sandstone 132 formation, requires a smaller $G*T_E$ in order to resolve higher diffusivity. This may mean that the echo time $T_E$ is smaller if the magnetic gradient G is restricted by tool configuration. The mudstone 138 contains unconventional gas, so the desired activation set would be similar to that of unconventional shale 134 formation, but optimized for gas detection where high diffusivity must be resolved.

A run is a descent into the well 106 with a tool string 120 and its return to the surface 104. A tool string 120 may return to the surface mid run if there are problems with tools 122, 126, 128 that must be serviced or replaced. The tools included on a tool string 120 can be the same from one run to another, but often the tool string 120 will change from run to run. One or more passes make up a run. Each pass is a continuous movement of the tool string in a same direction through the wellbore 106. A change in traveling direction, e.g., from up to down, or down and then up, initiates a different pass through the formation. Each pass includes recorded data from the one or more logging tools 122, 126, 128. Some tools like, NMR logging tools 126, can be configured differently from one pass to another remotely without removing the tool string 120 from the well 106 in order to collect different or additional data. For the example formation stratigraphy, the ideal approach for collecting the NMR data 162 requires changing NMR activation sets 160 three times in a logging run over the formation 130. A logging pass from the bottom of the carbonate mudstone 138 to surface 104 will start with the T1-T2 Organic Shale activation set (as shown in Table 1) across the carbonate mudstone 138. The activation set would be changed to the T1-T2-D 3D activation set (as shown in Table 2) at the mudstone 138/limestone 136 formation boundary. Logging continues with the T1-T2 3D activation set across the limestone 136 and then the activation set will change back to the initial T1-T2 Organic Shale activation set (Table 1) at the limestone 136/shale 134 formation boundary. The logging pass is completed across the shale 134 formation followed by a final activation set change back to the T1-T2-D 3D activation set (Table 2) at the shale 134/sandstone 132 formation boundary. The T1-T2-D 3D activation set (Table 2) is used to complete logging across the sandstone 132.

In one embodiment, the logging system automatically changes the activation set as a function of depth. A tool string has a plurality of logging tools including both non-NMR and NMR tools. The change is triggered based on input from non-NMR logging tools (such as neutron, density, resistivity, etc. tools) which are placed ahead of the NMR logging tool along the direction of forward movement. The real-time response of one or more non-NMR logging tools is used to automatically determine the formation and then trigger the activation set change when the NMR logging tool reaches the location of the formation boundary. In one embodiment, engineering personnel determines the activation set change based on the real time response. In another embodiment, a machine learning (ML) algorithm identifies formation changes on the fly and triggers the activation set change at or just prior to formation property changes. In another embodiment, formation changes are well-known for a geographic area such as in an area of well-characterized stratigraphy like the Permian Basin. When changes and corresponding activation sets can be anticipated, based on surrounding well data, activation set change points or depths can be preset. The activation set is then compressed and transmitted from the surface to the NMR logging tool as an activation set file. The compression allows for rapid transmission such that the logging tool is able to accept the activation set and reconfigure the logging tool while continuing to move with minimal interruption to the collection of data.

In another embodiment, the logging system efficiently stores NMR data from a logging pass or passes with more than one activation set as a single set of records where each instance of data acquisition is tagged with its corresponding activation set. The multi-activation set data file stores a set of configuration records, data associated with the logging pass, and inversion model matrix elements precomputed for each different activation set.

The inversion model is a method of decoding an input echo train as measured by the NMR logging tool and calculating a T1 and T2 distribution associated with each echo train. Because calculating T1 and T2 distributions involves an indefinite integral, they cannot be known exactly but rather probabilistically. The memory stores an inversion model and associated matrix elements (which define the inversion model) for one or more activation sets. The inversion model matrix elements are used directly to calculate likely T1 and T2 distributions and depend on the NMR measurement parameters stored in the activation sets. The inversion model matrix elements may be precomputed and stored on the computer or computed in real time. Each activation set is associated with a set of inversion model matrices, but matrices may be the same for similar activation sets. In another embodiment, formation properties gathered from processing the NMR data are displayed as a continuous, single real-time log on a display even over activation set changes.

Compression and decompression allow for rapid transfer of the activation set eliminating the need to stop the tool string and minimizing gaps in the NMR data that is collected. A typical wireline telemetry may have an uplink data rate of 500 kb/s and a downlink data rate of 50 kb/s. File compression such as (GNU zip) may be applied to compress an activation set (e.g., XML file) to less than 1/10 of the uncompressed size, thereby reducing the downlink transfer of the new activation set XML files from 3 minutes to several seconds. If the logging speed of the tool string is 5-10 ft/min, a distance traveled from initializing a new activation set to completing the transmission of the activation set and initializing it on the NMR tool may be minimal, resulting in only a small gap in the collected NMR data. This gap is small enough that the tool string movement during the pass does not need to be stopped or reversed to collect missing data. Also, transmission of logging data to the surface does not need to be stopped, because each packet of data sent uphole still receives an acknowledgement message sent back to the downhole tool. Sufficient bandwidth exists for transmission of the activation set downhole without impacting other data.

FIG. 2 contrasts examples of structures for continuous and non-continuous NMR logging. A non-continuous logging data structure 202 contains a configuration record 204, 208 for each activation set initialization. The configuration record 204, 208 records the date and time, depth, "ActivationName" or other identifier, and "FreqSwpBand[0]" or frequency band sweep function for each activation set at each initialization. A data record 206, 210 records the date and time, depth, "T/D Activity" or direction of the logging pass, and "XMR Real Echo" which is the echo train captured at each depth. The data records 206, 210 shown here are truncated to one example depth in the interest of simplicity but would contain an entry for each depth at which an echo train is captured. Each activation set initialization will produce a set of data records. T1 T2 data record 206 contains the echo trains recorded under the configuration record 204 for the T1T2 activation set, while the T2 data record 210 contains the echo trains recorded under the T2 activation set from configuration record 208.

A continuous logging data structure 240 contains a configuration record 242 for an entire pass or run and a data record 244 for the same run. The configuration record 242 records a date and time, depth, "ActivationName" or other identifier, "FreqSwpBand[0]" or frequency identifier, and other necessary parameters. Each time an activation set is initialized, a corresponding entry is recorded in the configuration record 242. This may be written when the activation set trigger is determined or recorded when the activation set is initialized downhole and a confirmation message is returned to the computer at the surface. The data record 244 records a date and time, depth, "T/D Activity" or trip direction, "XMR Real Echo" or echo train data, and "Activation Index" or other identifier that corresponds to the activation set used to acquire each echo train. The activation set identifier may be encoded in metadata of the echo trace as it is recorded downhole so that all traces can be linked to an activation set even if they arrive at the computer uphole out of order. One data record 244 now contains all the echo train data for an entire pass or run. Data records 244 may also store calculated results (such as T1, T2, D, etc.) based on an echo train detected at a depth. The total configuration record and data record may contain information about the activation set and acquisition parameters, the inversion model data processing parameters, calculated results, as well as the acquired echo train itself for each measured depth. As the logging tool moves through the formation, data is added to the configuration record 242 and data record 244 to produce the single set of configuration records 242 and data records 244 for the entire run or pass.

Typically, the operating frequencies are determined at calibration time in the shop (e.g., offline) and not during logging passes. However, in one embodiment, a "Frequency Sweep Band" activation set may be used to determine a new set of operating frequencies due to the change in the environment between downhole and shop or test conditions. Then, engineering personnel selects whether to use the newly determined operating frequencies or the calibrated "Shop Calibration" frequencies. Actual operating frequencies are recorded with the configuration record. The example single set of configuration records 242 show that both activation sets T1T20SHAL and T203 use the frequency sweep band identified as "1" in the configuration record under the parameter "FreqSwpBand." These frequencies are sometimes used for calculations but mainly recorded to help troubleshoot problem data.

Each activation set is associated with inversion model matrix elements that may be precomputed and stored in memory. Precomputation may be performed offline since this process may take several minutes per activation set. Switching to another activation set will require calculation of additional inversion model matrix elements. A tag may be inserted in a configuration record to identify each activation set and associated inversion model matrix elements. In some cases, the tag in the data record may be an index of activation sets (i.e., 1, 2, etc.). For example, the index 1 may refer to the T203 activation set and the index 2 may refer to the T1T20SHAL activation set as is shown in the configuration record 242 in the "ActivationIndex" column.

With tagging, if one switches from activation set A to activation set B at some depth, and later switches back to activation set A, the computer can use the change of tag in the configuration record to initialize or reload inversion model matrix elements, to clear processing buffers for changes in inversion method, and to update output results curves.

The single set of configuration records 242 also facilitates separating the logging data associated with one activation set from the logging data from other activation sets, and processing the echo trains with the correct inversion matrix elements. The separately processed datasets can then be simply merged, by depth, into a single set of data records which can be used to generate a complete log of a run or pass.

Figure 3:
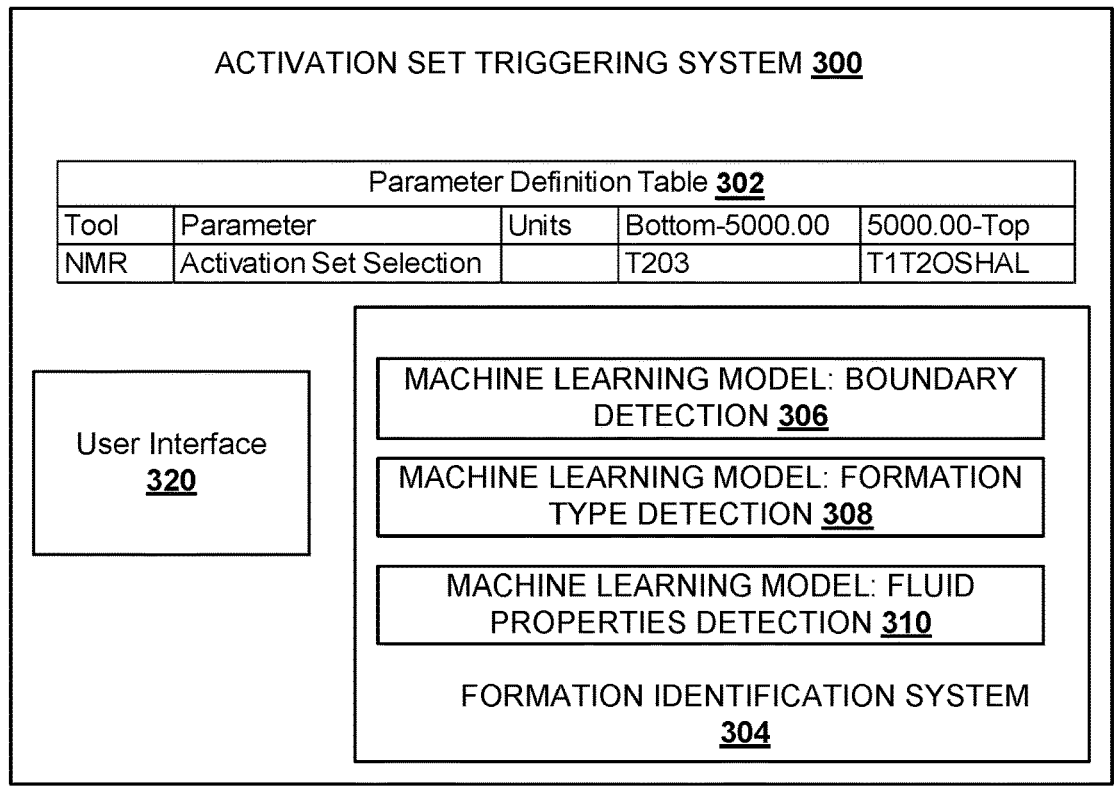
FIG. 3 illustrates an example of the activation triggering system.

FIG. 3 illustrates an example activation set change triggering system. An activation set change triggering system 300 ("triggering system") includes one or more components that facilitate determining an activation set as a logging tool approaches a different formation type. In FIG. 3, the components include one or more of a parameter definition table 302, a user interface 320, and a formation identification system 304.

In one embodiment, in an area where adjacent wells have been logged, formation top depths may be known. If so, the triggering system 300 can be preprogrammed in the parameter definition table 302. In the example parameter definition table 302, the activation sets identified as "T1T20SHAL" and "T203" are shown. The parameter definition table identifies at which depth or location in the geologic formation the activation set is to be changed. The activation logic may use the parameter definition table 302 to indicate change in the activation set which is sent to the NMR logging tool. The activation set T203 would be used to collect data between the bottom most recorded depth up to a depth of 5000 feet. Activation set T1T20SHAL would be applied between the depth of 5000 feet and the topmost recorded depth. The depths at which activation sets are changed will vary by wellbore and formation. In general, the parameter definition table 302 defines parameters or groups of parameters which are set to a constant value across a depth interval.

If formation tops cannot be known a priori, trigger points are selected on the fly. A simple measurement from a non-NMR tool, such as a gamma ray detector provides sufficient information to separate one formation type from another. For instance, a sudden switch from high-gamma ray (GR) readings to low-GR signals the formation change from a shale interval to a clean sand or carbonate interval, which can then trigger an NMR activation set change. The triggering system 300 may automatically trigger the activation set change based on the readings or the readings may be presented to operators on the user interface 320 or a display, and activation set changes can be initiated manually. For this example and the following examples, activation set change triggers can automatically change the activation set or can generate information such that the operator is alerted to a formation change and can manually change activation sets.

GR readings are not the only non-NMR tool information that can help to define a formation change. The tool string may have a resistivity or induction tool which qualitatively distinguishes hydrocarbon-bearing formations from water-bearing formations. A fast-logging activation set, such as a T2 activation set, can be used in the water-bearing interval, and a slower-logging, hydrocarbon-typing activation set, such as 3D T1-T2-D activation set, can be used across the more economically important reservoir interval to reduce the total logging time while also meeting logging objectives.

The tool string may have a neutron and density tool for detecting crossover of neutron and density log porosity. The crossover point between neutron levels and density log porosity is a good indicator for a conventional gas-bearing formation. Based on this crossover, the activation system may trigger a change to use a gas-typing sensitive activation set. Measurements from real-time results of multiple logging tools can be used to identify formation and fluid type changes. Using multiple tools to confirm formation information avoids false positives in the determination of formation change due to sudden noise surge in one of the logging tools thereby making the automatic activation set change more robust. For instance, neutron-density crossover coupled with higher resistivity reading, can be a much more robust gas zone indicator than any of these individual tool readings alone The formation identification system 304 has machine learning models 306, 308, 310 to identify formation properties triggering an activation set change. As more tool readings are included, activation set change logic and associated rules become more complex. The formation identification system 304 can be used to determine the boundaries and identities of multiple formations and to select appropriate activation sets. The formation identification system 304 may be arranged to detect formation bottoms rather than formation tops or formation tops in addition to formation bottoms. Reference to formation tops as described herein also refers to formation bottoms in addition or as an alternative.

The machine learning models 306, 308, 310 may be trained in a learning phase to perform automatic formation and boundary identification with logging data from multiple logging tools, including NMR, and multiple wells. The models 306, 308, 310 are then used in real-time logging of new wells for detecting tops of formations and formation properties. The ML identification in real-time may consist of three model components.

A first model is the ML model (ML1 or boundary model) 306 to indicate if the logging tool remains in the present rock formation, or is about to enter a different rock formation. The training data for ML1 306 is from one or more conventional logging measurements, such as, GR, Density, or Neutron-Density. The training data is organized into two categories: training data from a section of one rock formation, and training data from a section at the boundary of two different rock formations. Based on the training, ML1 306 will predict the ratio between the amounts of two different rock formations present in a measurement interval and identify the boundary of the two rock formations. A ratio limit may be established, such that the boundary model does not identify a boundary unless the ratio indicates a significant presence or interval of a second rock type.

A second model is the ML model (ML2 or type model) 308 that identifies the type of rock formation at the current logging depth, such as sandstone, an unconventional formation, limestone, shale, etc. The training data for ML2 308 is from one or more than one conventional logging measurements. A third model is the ML model (ML3 or fluid model) 310 that identifies changes in fluid properties based on NMR measurements and calculations, such as partial porosities, T2 log mean (T2LM), etc.

During the logging, ML1 306 is used to monitor if the rock formation is about to change (i.e., whether a tool is approaching a formation boundary) based on data acquired from conventional logging measurements for a recent section (for example, from the last ten feet). ML1 306 will indicate if there is more than one type of rock formation in the most recent section. ML2 308 is also applied to classify the rock types for each depth in the same section. The rock types from ML2 308 shall be in general agreement with the ones from ML1 306. For example, if 80% of rock types from ML2 308 agree with the ones from ML1 306 the data can be considered credible. Otherwise, it may indicate there is a new type of rock formation which is not currently covered by ML1 306 and ML2 308. In this case, ML1 306 and ML2 308 need to be updated with the new type of rock formation. The rock types will be further validated by the fluid property indicators derived from NMR data. For example, if an unconventional rock formation is indicated by ML1 306 and ML2 308, but there is a large amount of very long NMR data characteristic of carbonate rock, ML1 306 and ML2 308 will be updated. ML1 306 and ML2 308 can be updated in real-time with the newly acquired data with online, batch/mini-batch machine learning techniques. For example, a stochastic gradient descent method can be used to update ML1 306 and ML2 308 parameters with the conventional logging measurements acquired at a single depth or within a depth range. If all three components agree, and a predetermined minimal length interval has been logged, then changing of the activation set for the new rock formation is triggered.

Figure 4:
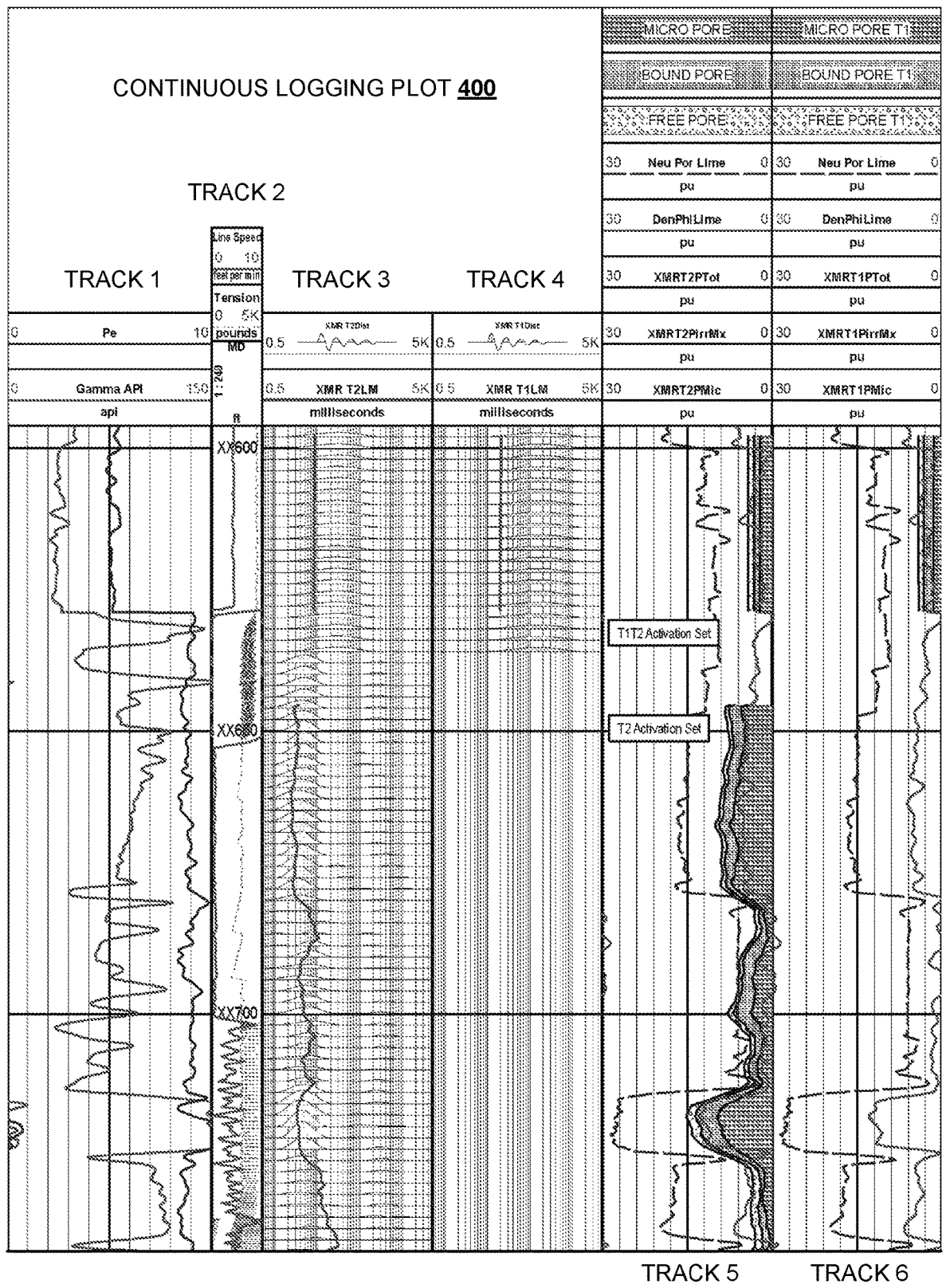
FIG. 4 illustrates an example of a continuous log plot for both NMR and non-NMR data displayed on a display of a computer.

FIG. 4 illustrates an example display of a continuous logging plot 400. The logging plot 400 displays continuously even though the activation set has been changed. The log plot may show data from multiple logging tools, rather than showing the logs from multiple logging tools on separate plots. Data may be associated with both NMR and non-NMR tools. Even though different activation sets may generate different data types, they can all be displayed sequentially at the depths where they were acquired. In addition, a tag associated with each activation set may be displayed on the real-time plot to show the activation set IDs associated with each formation interval and where the changes occurred. For example, in track 1 in FIG. 4, a gamma ray curve from a gamma ray detector is shown alongside a photo electric (Pe) curve from the neutron density tool. Neutron density porosity curves calculated with a limestone matrix are shown in track 5, while track 6 shows spectral density data from a dual spaced neutron tool. Tracks 3 and 4 show uninterrupted T2 and T1 NMR data which is logged in parallel with the non-NMR data in a single pass.

To enable this display, the log display template is initialized that allows maximum graphics display types (curves, wiggle traces, image maps, etc.) in the display real estate in order to show all types of data from various tools. Further, the log may display logs associated with different activation sets with minimal gaps in the logging data as the activation sets are changed.

Figure 5:
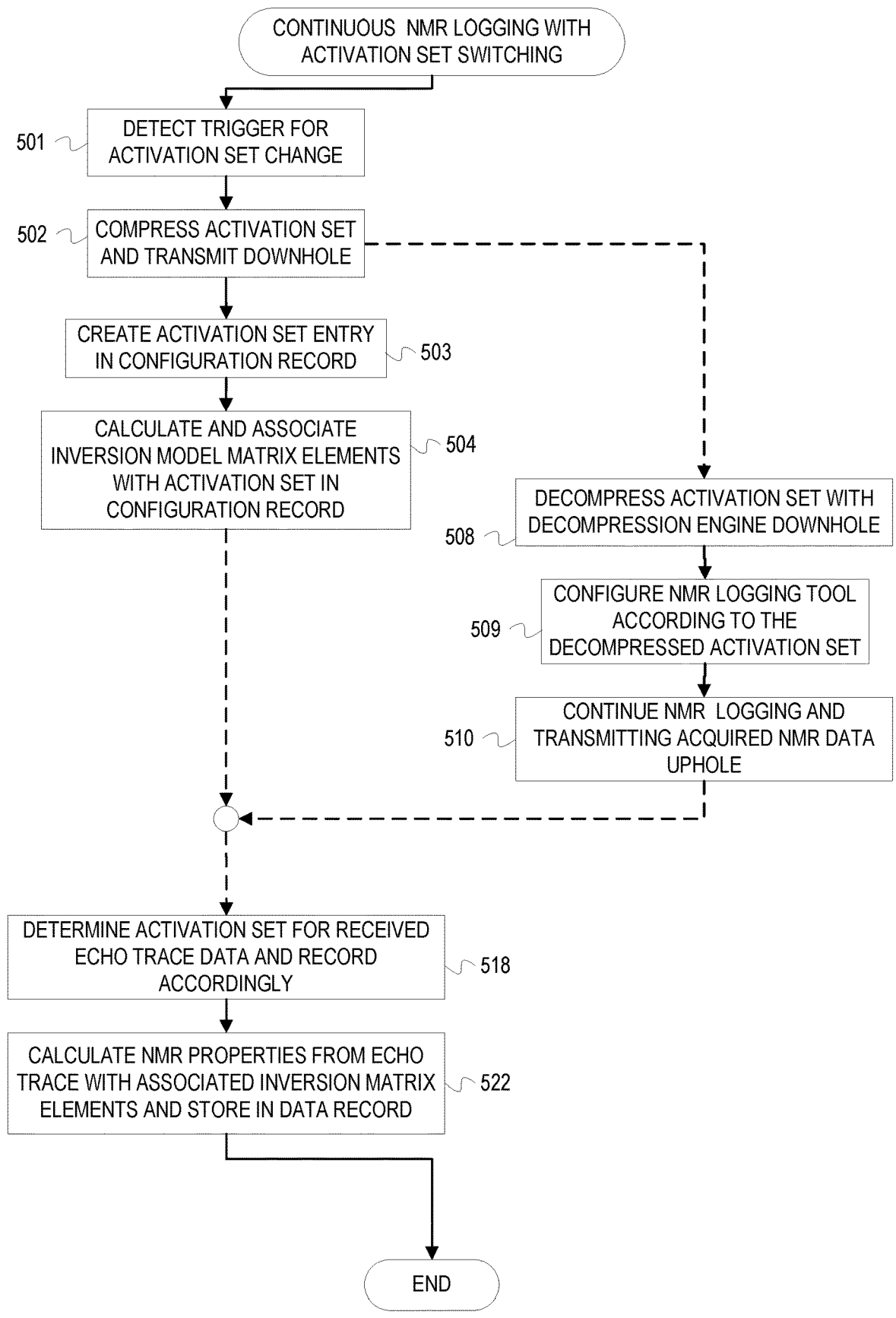
FIG. 5 is a flowchart of example operations for continuous NMR logging through changing formation properties with NMR activation set switching.

FIG. 5 is a flowchart of example operations for continuous NMR logging through changing formation properties with NMR activation set switching. The operations may be performed according to program code loaded on an NMR tool downhole in a wellbore of a geologic formation or a computer on a surface of the geologic formation. The program code may be distributed across devices. For convenience, the program code is referred to as the "surface adaptive logger" and "downhole adaptive logger" when describing the operations of FIG. 5. The surface adaptive logger refers to the program code running at the surface while the downhole adaptive logger refers to the program code running on the NMR tool or on a computing device proximate to the NMR tool.

Figure 6:
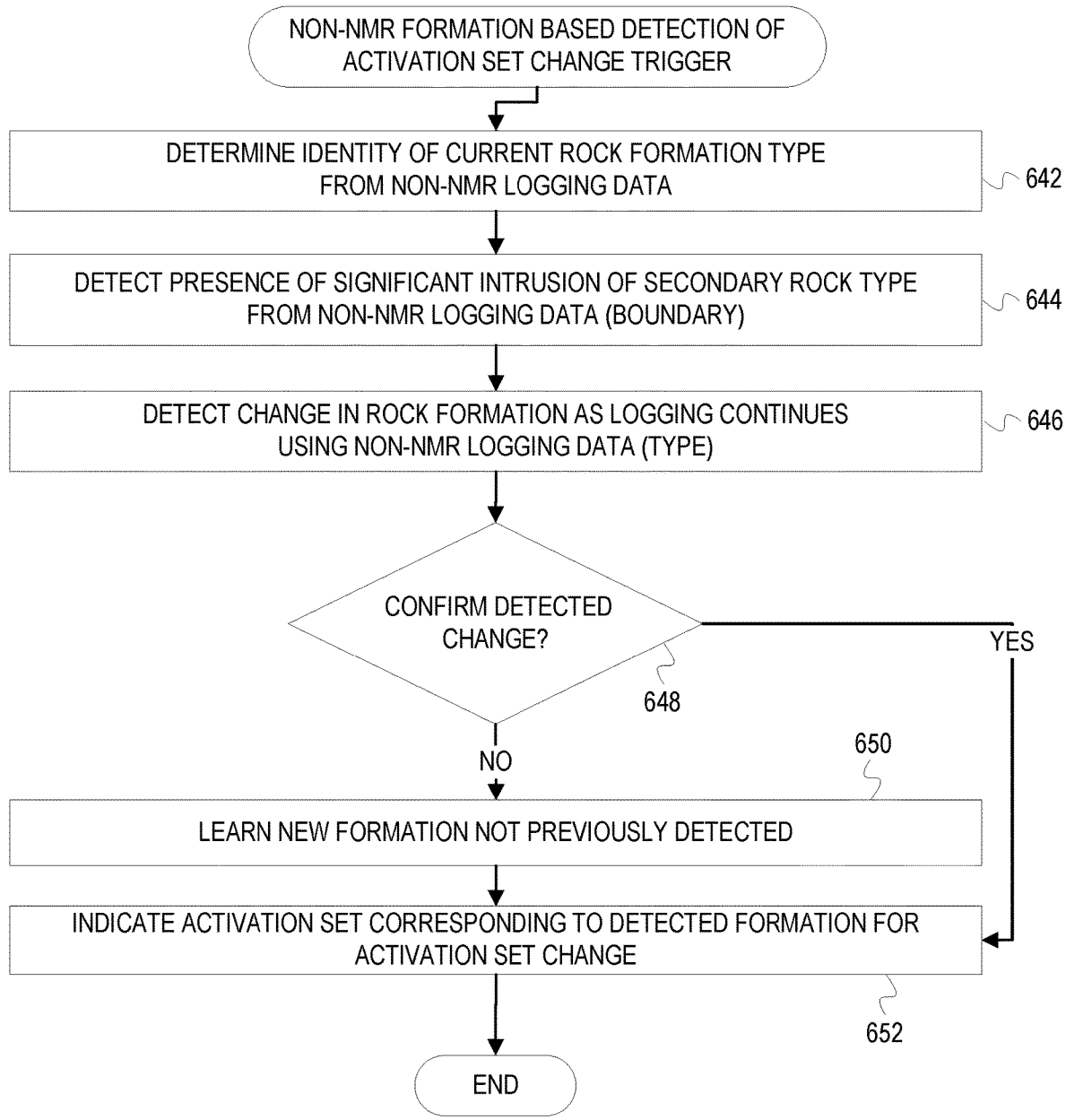
FIG. 6 is a flowchart of example operations for detecting an activation set change trigger based on non-NMR formation detection data.

At block 501, the surface adaptive logger determines an activation set change is desired for the NMR tool based on a change trigger indication. As discussed above, the trigger may be based on a preset depth or formation properties. The activation set may be selected based on prior knowledge of the formation properties, prior logging results, by engineering personnel, or identified by a machine learning model. FIG. 6 provides example operations for detecting an activation set change trigger. The surface adaptive logger determines a descriptor or identifier for the formation type being approached. This can be a label or tag that is also associated with an activation set. The surface adaptive logger links the descriptor or identifier to the activation set that will be provided to the NMR tool downhole.

At block 502, the surface adaptive logger compresses the activation set and transmits the compressed activation set to the NMR tool. The surface adaptive logger can compress the activation set with a variety of compression techniques. Selection may depend upon environmental constraints for a corresponding decompression engine downhole.

At block 503, the surface adaptive logger inserts a new entry with the new activation set information in a configuration record or log after selecting the activation set. The surface adaptive logger can update the configuration record with an identifier and/or description of the activation set (determined for the change in formation type and/or formation fluid), the formation/fluid properties (or a reference(s) to the formation/fluid properties), and a time of the activation set change.

Then at block 504, the surface adaptive logger calculates inversion model matrix elements for the selected activation set. The surface adaptive logger then associates the calculated elements with the activation set information. For instance, the surface adaptive logger creates the new entry or updates the new entry in the configuration record (created at block 503) with the calculated inversion model matrix elements.

At 508, the downhole adaptive logger decompresses the compressed activation set received from the surface adaptive logger. The dashed line between blocks 502 and 508 represents the transmission time for the compressed activation set to travel downhole and transition to downhole operations. The downhole adaptive logger either includes program code or communicates with program code implementing the network protocol used for transmission of the compressed activation set. Assuming a single utilized compression algorithm, the downhole adaptive logger passes the received, compressed activation set to the decompression engine implementing the decompression algorithm. If multiple decompression engines are available downhole, then the downhole adaptive logger will read a prior communication or header information, as examples, to select an appropriation decompression engine.

At block 509, the downhole adaptive logger configures the NMR tool with the decompressed activation set. The downhole adaptive logger communicates or sets the data acquisition parameters indicated in the activation set for the NMR logging tool. The downhole adaptive logger also configures or updates the activation set identifier to be associated with NMR data collected according to the changed configuration. This identifier may be stored in the metadata of the echo traces as they are recorded downhole.

At block 510, the downhole adaptive logger causes the NMR logging tool to continue NMR logging. To set the data acquisition parameters of the NMR logging tool, the downhole adaptive logger briefly pauses the NMR logging tool sufficient to set the data acquisition parameters. Despite the pause to change the NMR data acquisition parameters, the logging data is continually transmitted to the surface. Data received after the configuration change will be associated with the new activation set identifier.

Dashed lines from block 504 and block 510 to block 518 represent time for communication of acquired NMR data from downhole to the uphole/surface device.

At block 518, the surface adaptive logger determines an activation set for received NMR echo trace data and stores the received data accordingly. Since receipt of NMR data from downhole continues through changing of activation sets, the surface adaptive logger may receive NMR data corresponding to different activation sets after sending the compressed activation set. Thus, the surface adaptive logger reads header data, for example, of the received NMR data for an activation set identifier. The surface adaptive logger then stores the received NMR data based on the activation set identifier. For example, the surface adaptive logger accesses the data record based on the configuration record and updates an entry identified by the activation set identifier with the received NMR data. As another example, the surface adaptive logger stores the received NMR data separately from the configuration record but tags the received NMR data with the activation set identifier.

After the echo trace data is stored, the surface adaptive logger determines previously calculated inversion matrix elements for processing the received NMR data at block 522. If the NMR data corresponds to the activation set that has been sent downhole, then inversion matrix elements are those calculated at block 504. Otherwise, the inversion matrix elements to be used will be those corresponding to the activation set prior to the change. The continuous NMR data for an entire pass or run is then stored together in a data record and plotted or displayed, for example, as shown in FIG. 4.

The trigger for changing of an activation set can vary. The trigger may be based on fluid properties calculated from NMR data, may be based on a defined logging parameter, and/or may be based on non-NMR data. A system can be configured to use one or more of these different types of triggers for changing an activation set and can switch between trigger types. As an example, a system may begin with logging-parameter-based triggers until a defined time has elapsed or depth has been reached and switch to non-NMR based triggers.

If an adaptive logger is configured to change activation sets based on NMR data, then the adaptive logger detects a change in fluid properties based on the calculated fluid properties stored in a data record. Fluid properties can be any of the T1 and T2 distributions or log mean, diffusivity, etc. that indicate a change in fluid as a function of change in location. If the current activation set does not provide enough information to definitively identify or sufficiently characterize the new fluid, a change in activation set is triggered. The adaptive logger selects an activation set based on the new fluid properties. The activation set is chosen to resolve the properties of economically valuable hydrocarbons while maximizing logging speed over less valuable water and brine intervals. The new activation set identity may be determined by a machine learning algorithm or selected by an operator based on the change in fluid parameters than indicate a new fluid identity. The new activation set identity is then sent to the surface adaptive logger for continuous NMR logging with activation set switching.

For activation set triggering based on logging parameter data, the adaptive logger detects that a logging parameter set as a trigger point has been reached. The parameter definition table defines a logging parameter, such as depth, time, etc., that can be used to switch activation sets. The logging parameter is not a calculated value based on NMR or non-NMR logging data. The trigger point identifies a preset value at which a predetermined activation set change is to be triggered. An actual trigger point can be identified, such as 5000 ft of depth, or regions in which specific activation sets are to be used can be identified, such as activation set 1 from the surface to 5000 ft of depth. If regions or ranges are defined for specific activation sets, the trigger points are the intervals where activation set regions change. The adaptive logger changes to the new activation set that corresponds to the current logging parameters. Logging continues when the activation set change is triggered and the logging parameter continues to update. Additional activation set triggers may be defined in the parameter definition table for a single run or pass.

FIG. 6 is a flowchart of example operations for detecting an activation set change trigger based on non-NMR formation detection data. The operations are described as being performed by the surface adaptive logger for consistency with the earlier description. However, program code naming, organization, and deployment can vary due to arbitrary programmer choice, programming language(s), platform, etc.

At block 642, the surface adaptive logger determines the identity of the current stratum of the geological formation. The identity of this rock layer is determined with data from at least one of possibly multiple non-NMR tools that make up a tool string. The data provided by the non-NMR tools is compared to a database of expected values in order to match the current formation to a known formation. The more non-NMR data used to identify the formation type, the more robust this identification will be. Once an identification has been made, the current formation type is stored and compared against new data detected by non-NMR tools as the logging pass continues.

At block 644, the surface adaptive logger detects, in the non-NMR data, data that corresponds to a second rock type, or fails to correspond to the originally identified rock type. In order to avoid changing the activation set for minor intrusions of new rock stratum, a measurement interval is maintained. A ratio is determined between the amount of new rock (in length or depth) and the amount of original rock (a linear amount) in this measurement interval. If the ratio of new rock type to old rock type is higher than a pre-set minimum, a "boundary" between rock types is determined to exist.

At block 646, the surface adaptive logger detects a second formation type. This occurs when the non-NMR data no longer corresponds best to the originally identified formation type when compared to a database of non-NMR logging tool values. The shift in identification may be subtle or sudden. When a new formation identification is determined, a change in "type" is determined to exist.

At block 648, the surface adaptive logger determines whether the detected changes in "boundary" and "type" can be confirmed. If the detection of a secondary formation type and its identity match over a pre-set minimum of the measurement interval, detection of a formation change is confirmed. However, if the detection of a boundary and the detection of a secondary formation type do not match over the measurement interval, the change detection is not confirmed. This can occur because the boundary is spread out over a larger interval than is included in the measurement interval, or because the logging tool has encountered a formation type that is not included in the formation type database. In either of these cases, an operator may determine that the machine learning algorithms are to be updated to include a different measurement interval or an additional formation type. If the detection is not confirmed, then flow continues to block 650. Otherwise, flow continues to block 652.

At block 650, if the "boundary" and "type" determination are not in a minimum of agreement (i.e., change detection not confirmed) a new formation type may be learned. This involves updating the database for inclusion of a new rock type. If a machine learning algorithm is being used to detect formation changes, the algorithm is retrained or additionally trained on the new formation type. The new formation type may be known from other wells or formations and not previously included from the database, or it may be an unknown formation. For an unknown formation, an activation set to obtain maximum possible information may be used to aid in formation identification.

At block 652, the surface adaptive logger indicates an activation set corresponding to the detected formation type as the desired activation set to be triggered. This activation set may be chosen from the database of formation types or may be determined by an operator. The activation set is chosen such that it optimizes information about economically viable hydrocarbons and also minimizes logging time.

Flowcharts are provided to aid in understanding the illustrations and are not to be used to limit scope of the claims. The flowcharts depict example operations that can vary within the scope of the claims. Additional operations may be performed; fewer operations may be performed; the operations may be performed in parallel; and the operations may be performed in a different order. For example, the operations depicted in blocks 503 and 509 can be performed in parallel or sequentially. It will be understood that each block of the flowchart illustrations and/or block diagrams, and combinations of blocks in the flowchart illustrations and/or block diagrams, can be implemented by program code. The program code may be provided to a processor of a general-purpose computer, special purpose computer, or other programmable machine or apparatus.

Figure 7:
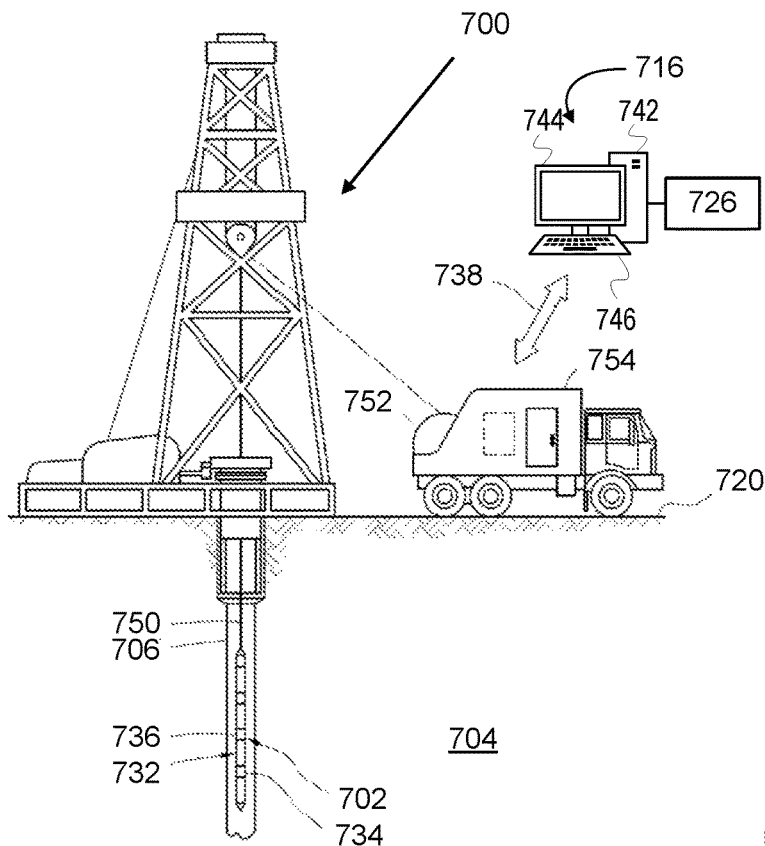
FIG. 7 is a schematic diagram of apparatus for acquiring NMR data while activation sets associated with the NMR logging tool are changed.

FIG. 7 is a schematic diagram of an apparatus 700 for acquiring NMR data based on the processes described with respect to FIG. 1-6. The apparatus 700 shows a logging tool 702 containing individual logging tools 732, 734, and 736 on a wireline 750. As illustrated, a borehole 706 may extend through the geologic formation 704. It should be noted that while FIG. 7 generally depicts a land-based drilling system, those skilled in the art will readily recognize that the principles described herein are equally applicable to subsea drilling operations that employ floating or sea-based platforms and rigs, without departing from the scope of the disclosure.

As illustrated, hoist 752 may be used to run the logging tool 702 into borehole 706. Hoist 752 may be disposed on a recovery vehicle 754. Hoist 752 may be used, for example, to raise and lower wireline 750 in borehole 706. While hoist 752 is shown on recovery vehicle 754, it should be understood that wireline 750 may alternatively be disposed from a hoist 752 that is installed at the surface 720 instead of being located on recovery vehicle 754. Logging tool 702 may be suspended in borehole 706 on wireline 750. Other conveyance types may be used for conveying logging tool 702 into borehole 706, including coiled tubing, wired drill pipe, slickline, and downhole tractor, for example. Logging tool 702 may comprise a tool body, which may be elongated as shown on FIG. 7. Tool body may be any suitable material, including without limitation titanium, stainless steel, alloys, plastic, combinations thereof, and the like. Logging tool 702 may further include an NMR tool 732 and one or more non-NMR 734, 736 logging tools. The non-NMR tools may be above or below the NMR tool and therefore before or after the NMR tool depending on the direction of the logging pass.

Computer 716 may include a processing unit 742, a monitor 744, an input device 746 (e.g., keyboard, mouse, etc.), and/or machine-readable media 726 (e.g., optical disks, magnetic disks) that can store code for changing activation sets associated with the NMR logging tool as described herein. To facilitate this change, communication link 738 (which may be wired or wireless, for example) may transmit logging data from the logging tool 702 to the computer 716 at the surface 720 and compressed activation sets from the computer 716 to the logging tool 702. The processing unit 742 may store configuration and data records associated with the activation set to facilitate determination of formation properties via an inversion model process. The activation sets may also be associated with precomputed inversion model matrix elements to facilitate the inversion. The monitor 744 may display continuous log plots of the formation properties determined by the NMR data even though activation sets are changed during the logging. In one or more examples, the processing unit 742 may be located downhole and/or be a part of the logging tool 702.

Figure 8:
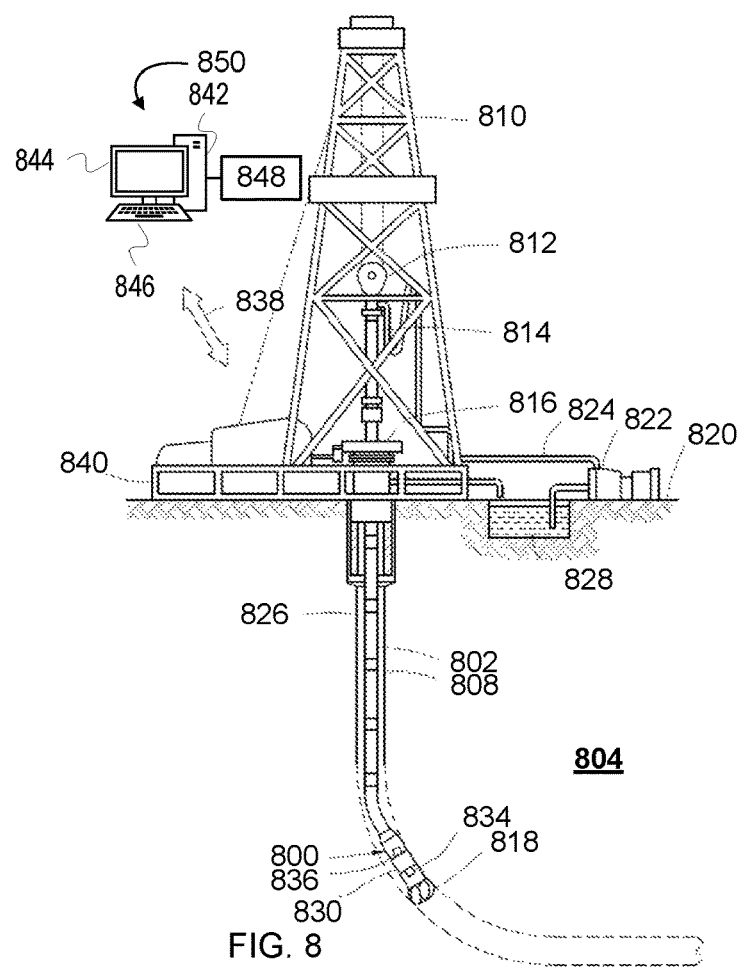
FIG. 8 is another schematic diagram of apparatus for acquiring NMR data while activation sets associated with the NMR logging tool are changed.

FIG. 8 is another schematic diagram of an apparatus for measuring NMR data in a geologic formation based on the processes described with respect to FIG. 1-6. The apparatus includes a logging tool 800 disposed on a drill string 802. As illustrated, a borehole 808 may extend through geologic formation 804. While borehole 808 is shown extending generally vertically into the geological formation 804, the principles described herein are also applicable to boreholes that extend at an angle through the geological formation 804, such as horizontal and slanted boreholes. For example, although FIG. 8 shows a vertical or low inclination angle well, high inclination angle or horizontal placement of the well and equipment is also possible. It should further be noted that while FIG. 8 generally depicts a land-based operation, those skilled in the art will readily recognize that the principles described herein are equally applicable to subsea operations that employ floating or sea-based platforms and rigs, without departing from the scope of the disclosure.

The apparatus further includes a drilling platform 840 that supports a derrick 810 having a traveling block 812 for raising and lowering drill string 802. Drill string 802 may include, but is not limited to, drill pipe and coiled tubing, as generally known to those skilled in the art. A kelly 814 may support drill string 802 as it may be lowered through a rotary table 816. A drill bit 818 may be attached to the distal end of drill string 802 and may be driven either by a downhole motor and/or via rotation of drill string 802 from the surface 820. Without limitation, drill bit 818 may include, roller cone bits, PDC bits, natural diamond bits, any hole openers, reamers, coring bits, and the like. As drill bit 818 rotates, it may create and extend a borehole 808 that penetrates various subterranean formations such as 804. A pump 822 may circulate drilling fluid through a feed pipe 824 to kelly 814, downhole through interior of drill string 802, through orifices in drill bit 818, back to surface 820 via an annulus 826 between the drill string 802 and the borehole 808, and into a retention pit 828.

Drill bit 818 may be just one piece of a downhole assembly that may include the logging tool 800. Logging tool 800 may be made of any suitable material, including without limitation titanium, stainless steel, alloys, plastic, combinations thereof, and the like. Logging tool 800 may further include an NMR tool 830 and one or more non-NMR logging tools 834, 836. The NMR tool 830 may be located above or below the non-NMR tools 834, 836 such that it is either before or after the non-NMR tools in the direction travel of a logging pass. The NMR tool 830 and non-NMR tools 834, 836 may be disposed in any other arrangement on logging tool 800. Any suitable technique may be used for transmitting response data from the logging tools 830, 834, 836 to a computer system 850 residing on the surface 820. As illustrated, a communication link 838 may be provided that transmits the response data from the logging tool 800 to the computer system 850 at the surface 820. Communication link 838 may implement one or more of various known telemetry techniques such as mud-pulse, acoustic, electromagnetic, etc. Alternatively, the response data may be stored in the logging tool 800 and processed at surface 820 or another location after withdrawal of logging tool 800 from borehole 808. Computer system 850 may include a processing unit 842, a monitor 844, an input device 846 (e.g., keyboard, mouse, etc.), and/or machine readable media 848 (e.g., optical disks, magnetic disks) that can store code for changing activation sets associated with the NMR logging tool as described herein. To facilitate this change, communication link 838 (which may be wired or wireless, for example) may transmit logging data from the logging tool 800 to the computer system 850 at surface 820 and compressed activation sets from the computer to the logging tool. The processing unit 842 may store the NMR data in data records associated with the activation set to facilitate determination of formation properties via an inversion process. The activation sets may also be associated with precomputed inversion model matrix elements to facilitate the inversion. The monitor 844 may display continuous log plots of the formation properties determined by the NMR data even though activation sets are changed during the logging. In one or more examples, the processing unit 842 may be located downhole and/or be a part of the logging tool 800.

Figure 9:
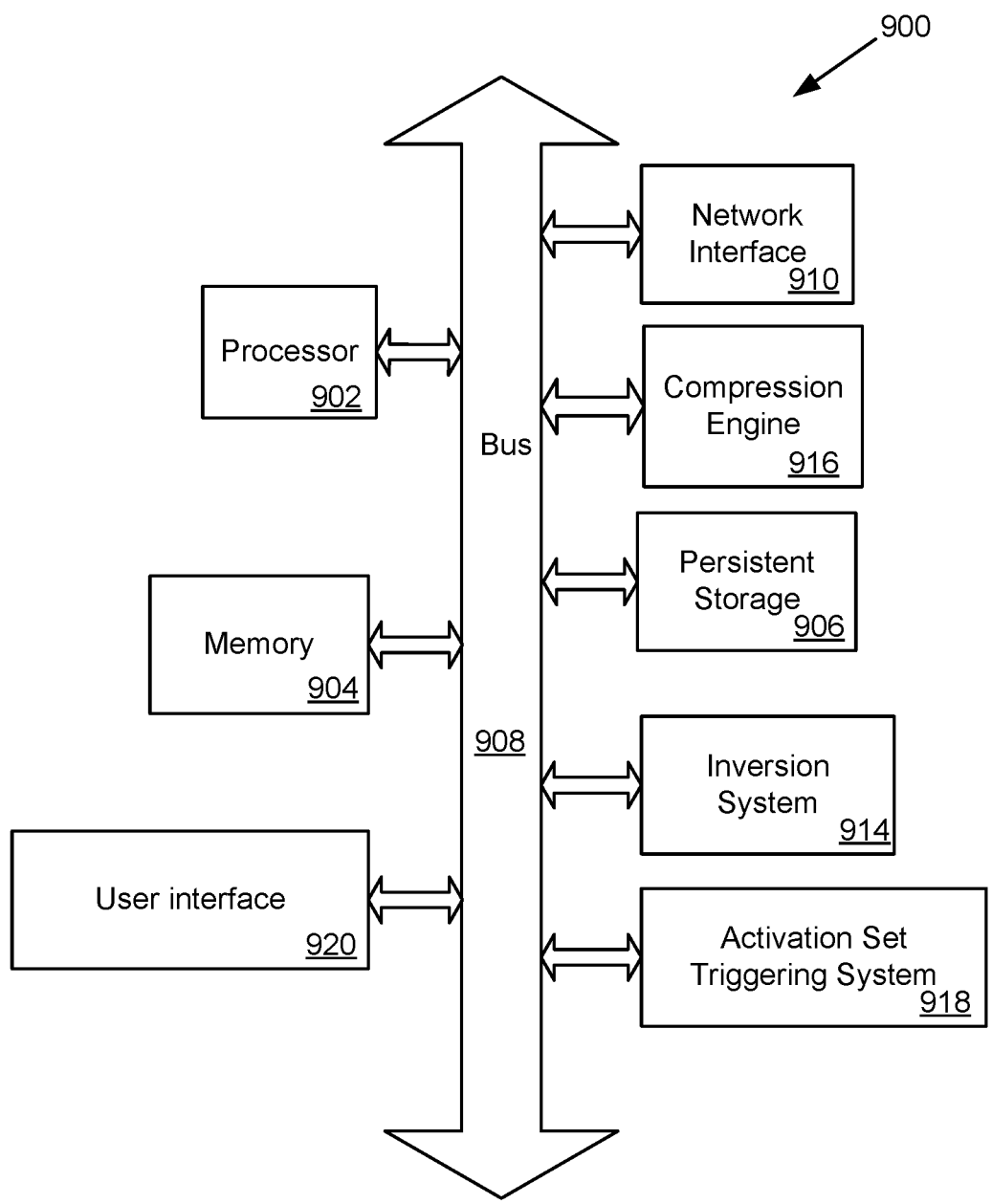
FIG. 9 is a block diagram of a computer system for acquiring NMR data while activation sets associated with the NMR logging tool is changed.

FIG. 9 is a block diagram of the computer in FIG. 1 in more detail. The computer 900 includes a processor 902 (possibly including multiple processors, multiple cores, multiple nodes, and/or implementing multi-threading, etc.) and memory 904. The memory 904 may be system memory (e.g., one or more of cache, SRAM, DRAM, zero capacitor RAM, Twin Transistor RAM, eDRAM, EDO RAM, DDR RAM, EEPROM, NRAM, RRAM, SONOS, PRAM, etc.) or any one or more other possible realizations of non-transitory machine-readable media/medium. The computer 900 may also include a persistent data storage 906. The persistent data storage 906 can be a hard disk drive, such as a magnetic storage device which stores one or more data records, configuration records, and activation sets associated with NMR data acquired by the NMR logging tool. The computer 900 also includes a bus 908 (e.g., PCI, ISA, PCI-Express) and a network interface 910 in communication with a logging tool. The network interface may facilitate receiving logging data collected by the tool string and transmitting the activation set to the tool string. The computer 900 may also have one or more of an activation set triggering system 918 for selecting an activation set stored in the persistent memory, a compression engine 916 for compressing the activation set for transmission to the tool string, and an inversion system 914 for determining formation properties based on the acquired logging data received from the tool string.

In one or more examples, the computer 900 may further comprise a user interface 920. The user interface 920 may include a display such as a computer screen or other visual device to show one or more of log plots associated with the data collected by NMR and non-NMR tools to engineering personnel. The user interface 920 may also include an input device such as a mouse, keyboard so that the engineering personnel can indicate activation sets to use.

The computer 900 may implement any one of the previously described systems partially (or entirely) in hardware and/or software (e.g., computer code, computer instructions, program instructions, program code) stored on a non-transitory machine readable medium/media. In some instances, the software is executed by the processor 902. Further, realizations can include fewer or additional components not illustrated in FIG. 9 (e.g., video cards, audio cards, additional network interfaces, peripheral devices, etc.). The processor 902 and the memory 904 are coupled to the bus 908. Although illustrated as being coupled to the bus 908, the memory 904 can be coupled to the processor 902.

As will be appreciated, aspects of the disclosure may be embodied as a system, method or program code/instructions stored in one or more machine-readable media. Accordingly, aspects may take the form of hardware, software (including firmware, resident software, micro-code, etc.), or a combination of software and hardware aspects that may all generally be referred to herein as a "circuit," "module" or "system." The functionality presented as individual modules/units in the example illustrations can be organized differently in accordance with any one of platform (operating system and/or hardware), application ecosystem, interfaces, programmer preferences, programming language, administrator preferences, etc.

Any combination of one or more machine readable medium(s) may be utilized. The machine-readable medium may be a machine-readable signal medium or a machine-readable storage medium. A machine-readable storage medium may be, for example, but not limited to, a system, apparatus, or device, that employs any one of or combination of electronic, magnetic, optical, electromagnetic, infrared, or semiconductor technology to store program code. More specific examples (a non-exhaustive list) of the machine readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a machine-readable storage medium may be any tangible medium that can contain, or store a program for use by or in connection with an instruction execution system, apparatus, or device. A machine-readable storage medium is not a machine-readable signal medium. A machine-readable signal medium may include a propagated data signal with machine readable program code embodied therein, for example, in baseband or as part of a carrier wave. Such a propagated signal may take any of a variety of forms, including, but not limited to, electromagnetic, optical, or any suitable combination thereof. A machine-readable signal medium may be any machine-readable medium that is not a machine-readable storage medium and that can communicate, propagate, or transport a program for use by or in connection with an instruction execution system, apparatus, or device.

Program code embodied on a machine-readable medium may be transmitted using any appropriate medium, including but not limited to wireless, wireline, optical fiber cable, RF, etc., or any suitable combination of the foregoing. Computer program code for carrying out operations for aspects of the disclosure may be written in any combination of one or more programming languages, including an object oriented programming language such as the Java® programming language, C++ or the like; a dynamic programming language such as Python; a scripting language such as Perl programming language or PowerShell script language; and conventional procedural programming languages, such as the "C" programming language or similar programming languages. The program code may execute entirely on a stand-alone machine, may execute in a distributed manner across multiple machines, and may execute on one machine while providing results and or accepting input on another machine. The program code/instructions may also be stored in a machine readable medium that can direct a machine to function in a particular manner, such that the instructions stored in the machine readable medium produce an article of manufacture including instructions which implement the function/act specified in the flowchart and/or block diagram block or blocks.

While the aspects of the disclosure are described with reference to various implementations and exploitations, it will be understood that these aspects are illustrative and that the scope of the claims is not limited to them. In general, techniques for acquiring NMR data as described herein may be implemented with facilities consistent with any hardware system or hardware systems. Many variations, modifications, additions, and improvements are possible.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the disclosure. In general, structures and functionality presented as separate components in the example configurations may be implemented as a combined structure or component. Similarly, structures and functionality presented as a single component may be implemented as separate components. These and other variations, modifications, additions, and improvements may fall within the scope of the disclosure.

Use of the phrase "at least one of" preceding a list with the conjunction "and" should not be treated as an exclusive list and should not be construed as a list of categories with one item from each category, unless specifically stated otherwise. A clause that recites "at least one of A, B, and C" can be infringed with only one of the listed items, multiple of the listed items, and one or more of the items in the list and another item not listed.

Embodiment 1

A method comprising: detecting a change in a formation property, based, at least in part, on data from a first non-nuclear magnetic resonance (NMR) tool on a tool string; selecting a first NMR logging activation set based on the detected change; transmitting the first NMR logging activation set to an NMR tool on the tool string; and changing configuration of the NMR tool to being configured according to the first NMR logging activation set from a second NMR logging activation set while continuing to transmit NMR data acquired by the NMR tool according to the second NMR logging activation set effective prior to the change in configuration.

Embodiment 2

The method of Embodiment 1, wherein changing configuration of the NMR tool to being configured according to the first NMR logging activation set is also while at least the first non-NMR tool continues to acquire and record data.

Embodiment 3

The method of Embodiments 1 or 2, further comprising compressing the first NMR logging activation set for transmission to the NMR tool.

Embodiment 4

The method of any one of Embodiments 1-3, wherein detecting the change in the formation property comprises detecting the change in the formation property based, at least in part, on data from the NMR tool.

Embodiment 5

The method of any one of Embodiments 1-4, further comprising displaying a continuous log of formation properties based, at least in part, on NMR data acquired with the NMR tool for a single pass of the tool string through a wellbore and identifying NMR data by indications of the first and second NMR logging activation sets, wherein the NMR data was acquired with the NMR tool configured according to the first NMR logging activation set and with the NMR tool configured according to the second NMR logging activation set.

Embodiment 6

The method of any one of Embodiments 1-5, wherein detecting change in the formation property comprises detecting that the tool string has moved to a first location in a wellbore, wherein selecting the first NMR logging activation set based on the detected change comprises selecting the first NMR logging activation set based on the first NMR logging activation set being defined for the first location.

Embodiment 7

The method of any one of Embodiments 1-6, wherein the second NMR logging activation set is defined for a second location in the wellbore that precedes the first location.

Embodiment 8

The method of any one of Embodiments 1-7, wherein detecting the change in the formation property comprises inputting the data from the first non-NMR tool into a set of one or more models to generate a formation stratum identifier, wherein selecting the first NMR logging activation set comprises selecting the first NMR logging activation set based on the formation stratum identifier.

Embodiment 9

The method of any one of Embodiments 1-8, wherein transmitting the first NMR logging activation set comprises also transmitting an activation set identifier that identifies the first NMR logging activation set.

Embodiment 10

The method of any one of Embodiments 1-9 further comprising determining a set of inversion model matrix elements for the first NMR logging activation set and associating the set of inversion model matrix elements with an indication of the first NMR logging activation set.

Embodiment 11

The method of any one of Embodiments 1-10 further comprising: determining which of at least a first and second sets of inversion model matrix elements to use for a first set of received NMR data based on a NMR logging activation set identifier associated with the first set of NMR data, wherein the first set of inversion model matrix elements are associated with the first NMR logging activation set and the second set of inversion model matrix elements are associated with the second NMR logging activation set; and calculating T1 and T2 distributions with the first set of inversion model matrix elements if the NMR logging activation set identifier identifies the first NMR logging activation set and with the second set of inversion model matrix elements if the NMR logging activation set identifier identifies the second NMR logging activation set.

Embodiment 12

The method of any one of Embodiments 1-11, wherein detecting the change in the formation property comprises detecting a change in at least one of a fluid type and a formation stratum based, at least in part, on the data from the first non-NMR tool.

Embodiment 13

The method of any one of Embodiments 1-12, wherein detecting the change in the formation property comprises detecting a formation boundary based, at least in part, on the data from the first non-NMR tool.

Embodiment 14

A system comprising: a tool string having a nuclear magnetic resonance (NMR) tool and a first non-NMR tool; a processor; and a machine-readable medium having program code executable by the processor to cause the system to, detect a trigger to change to a first NMR logging activation set from a second NMR logging activation set while the tool string continues a run; transmit the first NMR logging activation set to the NMR tool; and change configuration of the NMR tool to being configured according to the first NMR logging activation set from the second NMR logging activation set while continuing to transmit NMR data acquired by the NMR tool according to the second NMR logging activation set effective prior to the change in configuration.

Embodiment 15

The system of Embodiment 14, wherein the program code to detect the trigger to change to the first NMR logging activation set comprises program code executable by the processor to cause the system to detect that the tool string is approaching a formation boundary between formation strata of different formation types based, at least in part, on data from the first non-NMR tool.

Embodiment 16

The system of Embodiments 14 or 15 further comprising a second non-NMR tool, wherein the program code to detect the formation boundary comprises the program code executable by the processor to detect the formation boundary based also on data from the second non-NMR tool.

Embodiment 17

The system of any one of Embodiments 14-16, wherein the machine-readable medium further has program code executable by the processor to cause the system to, associate a first set of inversion model matrix elements with the first NMR logging activation set and a second set of inversion model matrix elements with the second NMR logging activation set; and determine which of the first and second NMR logging activation sets to use for T1 and T2 distribution calculations for received NMR data based on which of the first and second NMR logging activation sets is identified with metadata of the received NMR data.

Embodiment 18

A non-transitory machine-readable medium having stored therein program code for continuous logging with nuclear magnetic resonance (NMR) logging activation set switching, the program code comprising instructions to, detect a trigger to change to a first NMR logging activation set from a second NMR logging activation set while logging continues with a tool string; transmit the first NMR logging activation set to an NMR tool; and change configuration of the NMR tool to being configured according to the first NMR logging activation set from the second NMR logging activation set while continuing to transmit NMR data acquired by the NMR tool according to the second NMR logging activation set effective prior to the change in configuration.

Embodiment 19

The non-transitory machine-readable medium of Embodiment 18, wherein the program code comprising instructions to detect the trigger to change to the first NMR logging activation set comprises program code instructions to detect that the tool string is approaching a formation boundary between formation strata of different formation types based, at least in part, on data from the first non-NMR tool.

Embodiment 20

The non-transitory machine-readable medium of Embodiments 18 or 19, wherein the program code further comprises program code instructions to, associate a first set of inversion model matrix elements with the first NMR logging activation set and a second set of inversion model matrix elements with the second NMR logging activation set, and determine which of the first and second NMR logging activation set to use for T1 and T2 distribution calculations for received NMR data based on which of the first and second NMR logging activation sets is identified with metadata of the received NMR data.

What is claimed is:

1. A method comprising:
   detecting a change in a formation property, based, at least in part, on data from a first non-nuclear magnetic resonance (NMR) tool on a tool string;
   selecting a first NMR logging activation set based on the detected change;
   transmitting the first NMR logging activation set to an NMR tool on the tool string; and,
   changing configuration of the NMR tool to being configured according to the first NMR logging activation set from a second NMR logging activation set while continuing to transmit NMR data acquired by the NMR tool according to the second NMR logging activation set effective prior to the change in configuration.

2. The method of claim 1, wherein changing configuration of the NMR tool to being configured according to the first NMR logging activation set is also while at least the first non-NMR tool continues to acquire and record data.

3. The method of claim 1, further comprising compressing the first NMR logging activation set for transmission to the NMR tool.

4. The method of claim 1, wherein detecting a change in formation property comprises detecting a change in formation property based, at least in part, on data from the NMR tool.

5. The method of claim 1, further comprising displaying a continuous log of formation properties based, at least in part, on NMR data acquired with the NMR tool for a single pass of the tool string through a wellbore and identifying NMR data by indications of the first and second NMR logging activation sets, wherein the NMR data was acquired with the NMR tool configured according to the first NMR logging activation set and with the NMR tool configured according to the second NMR logging activation set.

6. The method of claim 1, wherein detecting the formation property change comprises detecting that the tool string has moved to a first location in a wellbore, wherein selecting the first NMR logging activation set based on the detected change comprises selecting the first NMR logging activation set based on the first NMR logging activation set being defined for the first location.

7. The method of claim 6, wherein the second NMR logging activation set is defined for a second location in the wellbore that precedes the first location.

8. The method of claim 1, wherein detecting the formation property change comprises inputting the data from the first non-NMR tool into a set of one or more models to generate a formation stratum identifier, wherein the selecting the first NMR logging activation set comprises selecting the first NMR logging activation set based on the formation stratum identifier.

9. The method of claim 1, wherein transmitting the first NMR logging activation set comprises also transmitting an activation set identifier that identifies the first NMR logging activation set.

10. The method of claim 1 further comprising determining a set of inversion model matrix elements for the first NMR logging activation set and associating the set of inversion model matrix elements with an indication of the first NMR logging activation set.

11. The method of claim 10 further comprising:
   determining which of at least a first and second sets of inversion model matrix elements to use for a first set of received NMR data based on a NMR logging activation set identifier associated with the first set of NMR data, wherein the first set of inversion model matrix elements are associated with the first NMR logging activation set and the second set of inversion model matrix elements are associated with the second NMR logging activation set; and calculating T1 and T2 distributions with the first set of inversion model matrix elements if the NMR logging activation set identifier identifies the first NMR logging activation set and with the second set of inversion model matrix elements if the NMR logging activation set identifier identifies the second NMR logging activation set.

12. The method of claim 1, wherein detecting the change in the formation property comprises detecting a change in at least one of a fluid type and a formation stratum based, at least in part, on the data from the first non-NMR tool.

13. The method of claim 1, wherein detecting the change in the formation property comprises detecting a formation boundary based, at least in part, on the data from the first non-NMR tool.

14. A system comprising:
a tool string having a nuclear magnetic resonance (NMR) tool and a first non-NMR tool;
a processor; and
a machine-readable medium having program code executable by the processor to cause the system to,
detect a trigger to change to a first NMR logging activation set from a second NMR logging activation set while the tool string continues a run;
transmit the first NMR logging activation set to the NMR tool; and
change configuration of the NMR tool to being configured according to the first NMR logging activation set from the second NMR logging activation set while continuing to transmit NMR data acquired by the NMR tool according to the second NMR logging activation set effective prior to the change in configuration.

15. The system of claim 14, wherein the program code to detect the trigger to change to the first NMR logging activation set comprises program code executable by the processor to cause the system to detect that the tool string is approaching a formation boundary between formation strata of different formation types based, at least in part, on data from the first non-NMR tool.

16. The system of claim 15 further comprising a second non-NMR tool, wherein the program code to detect the formation boundary comprises the program code executable by the processor to detect the formation boundary based also on data from the second non-NMR tool.

17. The system of claim 14, wherein the machine-readable medium further has program code executable by the processor to cause the system to,
associate a first set of inversion model matrix elements with the first NMR logging activation set and a second set of inversion model matrix elements with the second NMR logging activation set; and
determine which of the first and second NMR logging activation sets to use for T1 and T2 distribution calculations for received NMR data based on which of the first and second NMR logging activation sets is identified with metadata of the received NMR data.

18. A non-transitory machine-readable medium having stored therein program code for continuous logging with nuclear magnetic resonance (NMR) logging activation set switching, the program code comprising instructions to,
detect a trigger to change to a first NMR logging activation set from a second NMR logging activation set while logging continues with a tool string;
transmit the first NMR logging activation set to an NMR tool; and
change configuration of the NMR tool to being configured according to the first NMR logging activation set from the second NMR logging activation set while continuing to transmit NMR data acquired by the NMR tool according to the second NMR logging activation set effective prior to the change in configuration.

19. The non-transitory machine-readable medium of claim 18, wherein the program code comprising instructions to detect the trigger to change to the first NMR logging activation set comprises program code instructions to detect that the tool string is approaching a formation boundary between formation strata of different formation types based, at least in part, on data from a first non-NMR tool.

20. The non-transitory machine-readable medium of claim 18, wherein the program code further comprises program code instructions to,
associate a first set of inversion model matrix elements with the first NMR logging activation set and a second set of inversion model matrix elements with the second NMR logging activation set, and
determine which of the first and second NMR logging activation set to use for T1 and T2 distribution calculations for received NMR data based on which of the first and second NMR logging activation sets is identified with metadata of the received NMR data.

* * * * *